(12) United States Patent
Zhu

(10) Patent No.: US 9,953,923 B2
(45) Date of Patent: Apr. 24, 2018

(54) METALLIZATION STACK AND SEMICONDUCTOR DEVICE AND ELECTRONIC DEVICE INCLUDING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

(*) Notice: Subject to any disclaimer, the term of this patent is extended or adjusted under 35 U.S.C. 154(b) by 0 days.

(21) Appl. No.: 15/462,475

(22) Filed: Mar. 17, 2017

(65) Prior Publication Data

US 2017/0271257 A1 Sep. 21, 2017

(30) Foreign Application Priority Data

Mar. 17, 2016 (CN) .......................... 2016 1 0153583

(51) Int. Cl.
*H01L 23/528* (2006.01)

(52) U.S. Cl.
CPC ................... *H01L 23/528* (2013.01)

(58) Field of Classification Search
CPC . H01L 23/52; H01L 23/528; H01L 23/53257; H01L 23/53204; H01L 23/531; H01L 23/5329
See application file for complete search history.

(56) References Cited

U.S. PATENT DOCUMENTS 7,148,535 B2 12/2006 Singh
2015/0318285 A1* 11/2015 Zhang ............... H01L 27/10844
257/295

FOREIGN PATENT DOCUMENTS

CN 1959976 A 5/2007
CN 104299956 A 1/2015

* cited by examiner

*Primary Examiner* — Cuong Q Nguyen
(74) *Attorney, Agent, or Firm* — Christensen, Fonder, Dardi & Herbert PLLC

(57) ABSTRACT

A metallization stack, comprising: at least an interlayer dielectric layer comprising a dielectric material and a negative capacitance material, wherein: at least a pair of first conductive interconnecting components formed in the interlayer dielectric layer, which are at least partially opposite to each other, comprise both the dielectric material and the negative capacitance material sandwiched between their opposite parts; and/or at least a second conductive interconnecting component formed in an upper interlayer dielectric layer and at least a third conductive interconnecting component formed in a lower interlayer dielectric layer, which are at least partially opposite to each other, comprise both the dielectric material and the negative capacitance material sandwiched between their opposite parts.

14 Claims, 9 Drawing Sheets

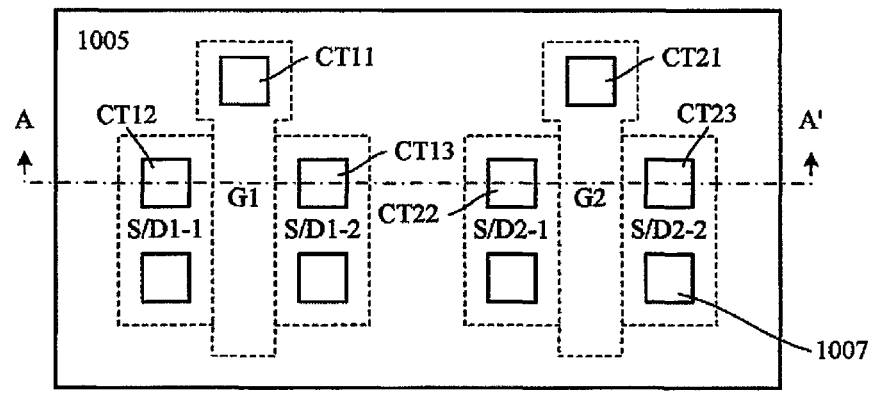
Fig. 3(b)
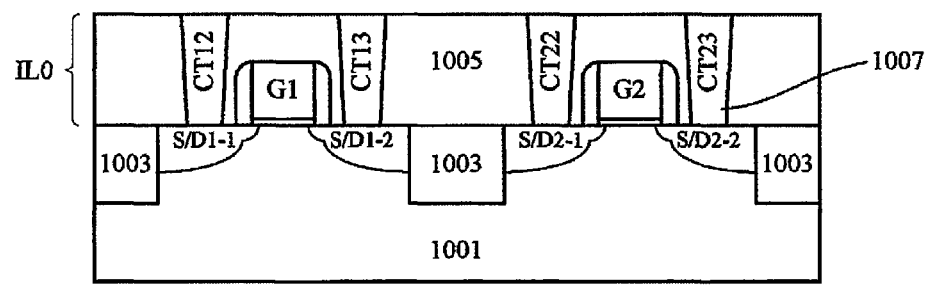
Fig. 3(b')

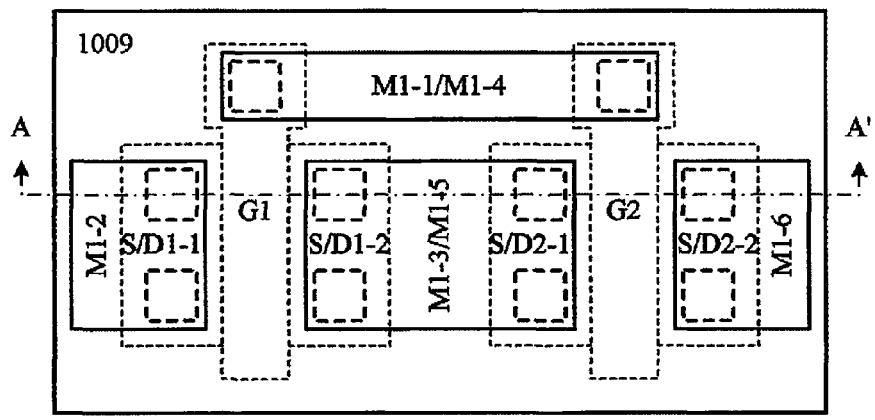
Fig. 3(c)
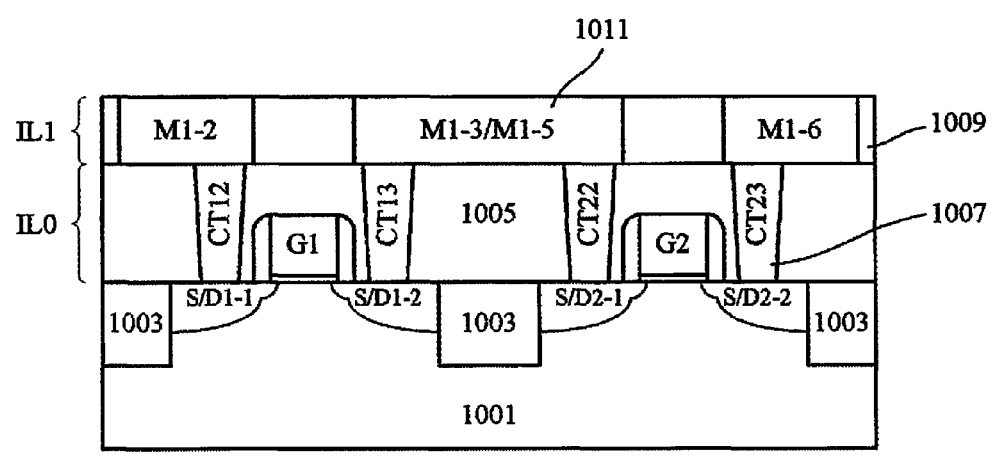
Fig. 3(c')

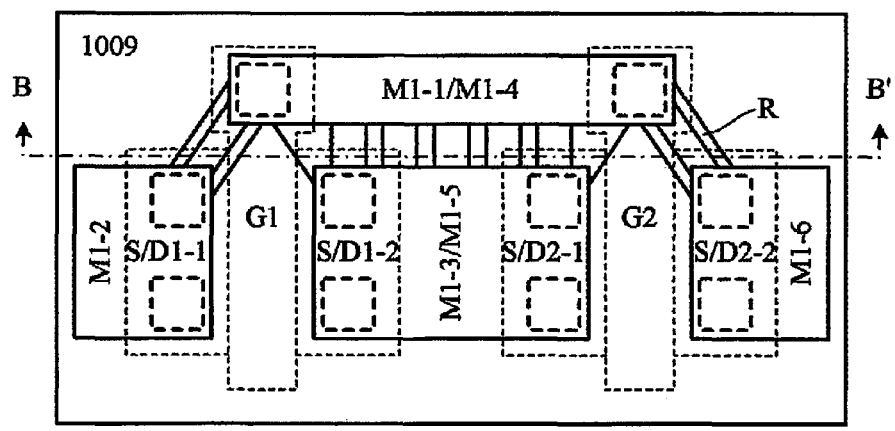
Fig. 3(d)
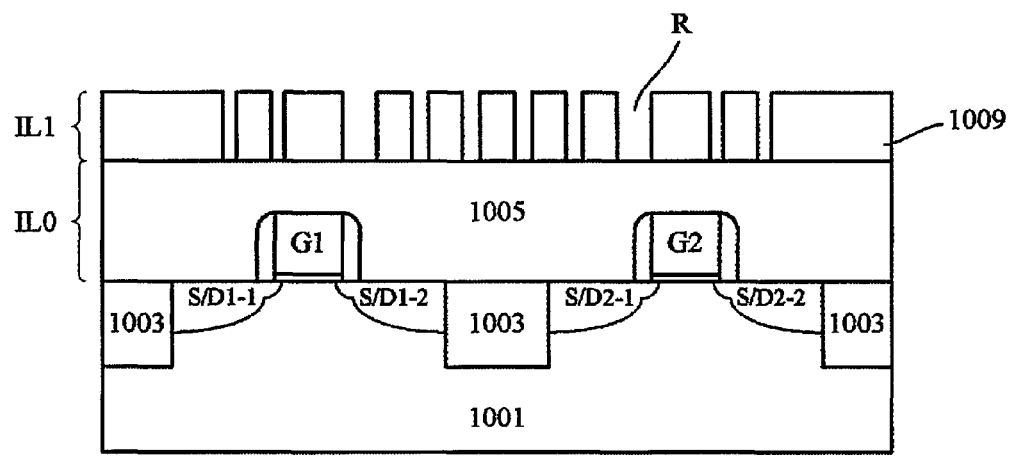
Fig. 3(d')

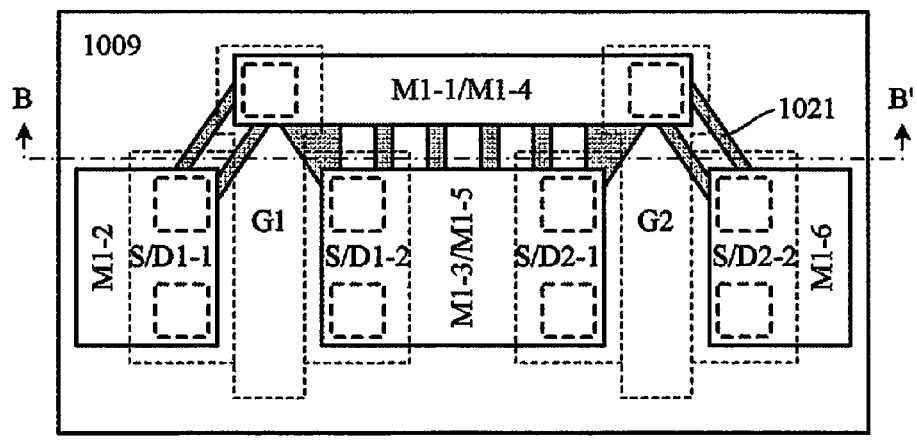
Fig. 3(e)
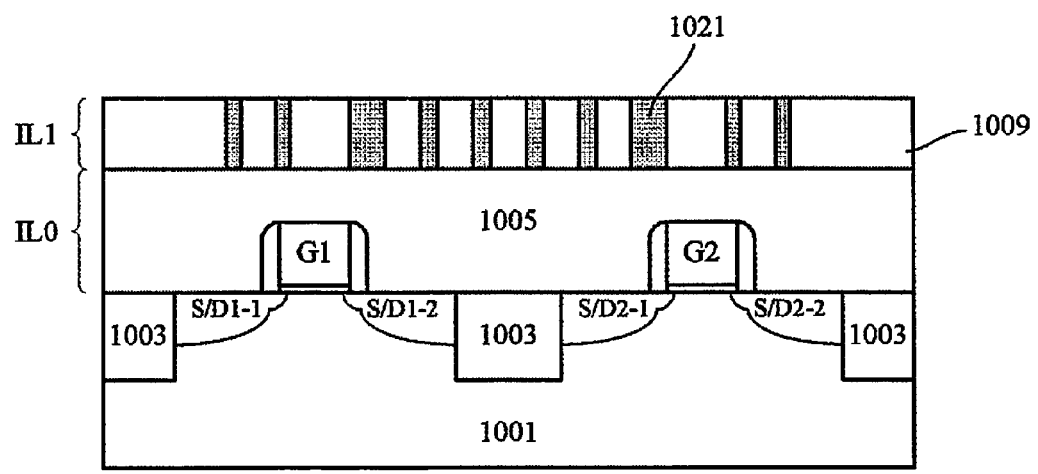
Fig. 3(e')

METALLIZATION STACK AND SEMICONDUCTOR DEVICE AND ELECTRONIC DEVICE INCLUDING THE SAME

CROSS-REFERENCE TO RELATED APPLICATION

This application claims priority to Chinese Patent Application No. 201610153583.0, filed on Mar. 17, 2016, which is incorporated herein by reference in its entirety.

TECHNICAL FIELD

The present disclosure relates to the field of semiconductor technology. In particular, the present disclosure relates to a metallization stack, which is capable to reduce a capacitance between conductive interconnecting components, and a semiconductor device and an electronic device including the same.

BACKGROUND

With increase of device density of integrated circuitry (IC), spacing between components decreases continuously. In the ICs, capacitance between conductive interconnecting components, especially interconnecting wirings, increases, causing degradation of IC performance. On the other hand, low power consumption is desirable even for devices of low performance, for which the capacitance also needs to be reduced. A method for reducing the capacitance is to form air gap between the interconnecting components, which may cause mechanical and/or electrical stability problems.

Therefore, low capacitance between the interconnecting components is desirable for the ICs.

SUMMARY

The present disclosure provides, among others, a metallization stack, which is capable to reduce a capacitance between conductive interconnecting components, and a semiconductor device and an electronic device including the same.

An aspect of the present disclosure provides a metallization stack, comprising at least an interlayer dielectric layer comprising a dielectric material and a negative capacitance material. At least a pair of first conductive interconnecting components formed in the interlayer dielectric layer, which are at least partially opposite to each other, comprise both the dielectric material and the negative capacitance material sandwiched between their opposite parts; and/or at least second conductive interconnecting component formed in an upper layer of the interlayer dielectric layer and at least a third conductive interconnecting component formed in a lower layer of the interlayer dielectric layer, which are at least partially opposite to each other, comprise both the dielectric material and the negative capacitance material sandwiched between their opposite parts.

Another aspect of the present disclosure provides a semiconductor device comprising the above-described metallization stack.

A further aspect of the present disclosure provides an electronic device comprising an integrated circuit including the above-described semiconductor device.

According to embodiments of the present disclosure, a pair of conductive interconnecting components, which are at least partially opposite to each other, comprise both the dielectric material and the negative capacitance material sandwiched therebetween, thereby generating both a positive capacitance and a negative capacitance between the pair of conductive interconnecting components. As a result, a total capacitance between the conductive interconnecting components can be reduced due to the existence of the negative capacitance, especially in case where the positive capacitance and the negative capacitance is connected in parallel.

BRIEF DESCRIPTION OF THE DRAWINGS

The aforementioned and other objects, characteristics, and advantages of the present disclosure will become more apparent from the following description of embodiments of the present disclosure with reference to the drawings, in which:

FIGS. 3(a)-3(e') schematically show sectional views of some stages in a process of manufacturing a metallization stack according to another embodiment of the present disclosure.

DETAILED DESCRIPTION

Figure 1:
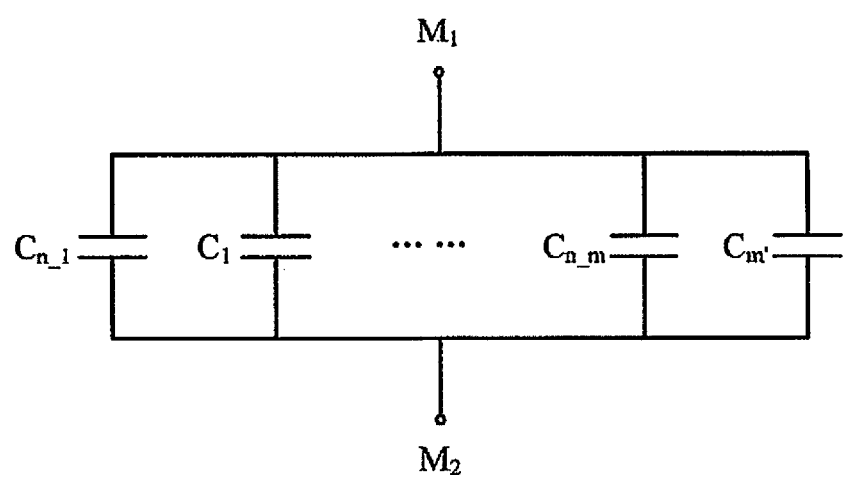
FIG. 1 schematically shows a circuit diagram of a capacitance between a pair of conductive interconnecting components according to an embodiment of the present disclosure.

Next, embodiments of the present disclosure will be described herein in detail with reference to the drawings. However, it should be understood that the description is only exemplary and does not intend to limit the scope of the present disclosure. Also, in the following description, description of well-known structures and technology will be omitted in order not to obscure concepts of the present disclosure unnecessarily.

Various structural diagrams are shown in the drawings according to embodiments of the present disclosure. These drawings are not drawn to scale. Some details are enlarged while some other details are omitted for clarity. Shapes of various regions and/or layers and relative dimensions or positions thereof are exemplarily shown but may vary due to manufacturing tolerance or technical limits in practice. Those skilled in the art can design regions and/or layers of different shapes, dimensions, or relative positions according to practical requirements.

In context of the present disclosure, when describing a structure of a device, a layer/component being "on top of" or "above" another layer/component means that, the layer/component is directly on the top of the other layer/component, or there are further layer(s) or component(s) therebetween. If the device is turned over, the layer/component is "beneath" or "below" the other layer/component.

FIG. 1 schematically shows a circuit diagram of a capacitance between a pair of conductive interconnecting components according to an embodiment of the present disclosure.

As shown in FIG. 1, a conductive interconnecting component $M_1$ and a conductive interconnecting component $M_2$ are formed in an interlayer dielectric layer (IL). The conductive interconnecting component may be any one of: e.g., a contact that is in contact with a terminal, such as a gate terminal, a source terminal, or a drain terminal, of a semiconductor device formed in a substrate; a conductive via that connects two layers; and a conductive interconnect or wiring that is arranged along a predefined path in the IL to connect the contacts/conductive vias or to connect the contact/conductive via to a terminal, e.g., a pad. Generally, the contact and the conductive via have a basically same structure comprising a conductive material, e.g., a metal such as Cu, Al, or W, filled in a through-hole in the IL. The conductive interconnect generally comprises a conductive material, e.g., a metal such as Cu, Al, or W, filled in a trench through the IL and extending in the IL along a predefined path. In addition, a diffusion barrier layer may be formed on a bottom or sidewall of the through-hole or trench.

The metallization stack may comprise a stack of a plurality of ILs, e.g., IL0, IL1, IL2, IL3, IL4 . . . numbered from a side nearest to a device. Any one or any combination of the contact, the conductive via, and the conductive interconnect may be formed in respective ILs. Typically, a contact corresponding to a device terminal may be formed in the IL0, which is nearest to the device. A conductive interconnect may be formed in the IL1 next to the IL0. A conductive via may be formed in the IL2 next to the IL1. Another conductive interconnect may be formed in the IL3. Another conductive via may be formed in the IL4, and so on. A desired connection may be formed in this way. It should be noted that a number and/or arrangement of the metallization stack are not limited to the example described herein. The metallization stack may be manufactured in, various ways, such as the Damascus process.

As the metallization stack may comprise a plurality of conductive interconnecting components, it is possible that some conductive interconnecting components may be at least partially opposite to each other. For example, two conductive interconnecting components in a same IL may have parts that are opposite to each other. Two conductive interconnecting components in different ILs may have parts that opposite to each other. As a result, a (positive) capacitance may be generated between the conductive interconnecting components due to the dielectric material, i.e., the body of the IL(s).

Typically, a capacitor comprises a plate-dielectric material-plate structure. The dielectric material can store charges. A conventional capacitor has a "positive" capacitance characteristic. That is, a voltage across the plates becomes greater when the charges stored in the dielectric material increase. In the present disclosure, such a material is called a regular dielectric material or dielectric material, which has a same meaning as it usually is in the semiconductor technical field. However, some materials have exhibit a "negative" capacitance characteristic in a certain state, that is, the voltage across the plates decreases when the charges stored in the dielectric material increase. For example, some ferroelectric material, such as a material comprising one selected from a group consisting of Hf, Zr, Ba, and Sr (e.g., one selected from a group consisting of $HfZrO_2$, $BaTiO_3$, $KH_2PO_4$ or NBT), may be polarized when being placed in a critical electrical field, accumulating a lot of bound charges on a surface of the material instantly, thereby minimizing a voltage across the ferroelectric material.

According to an embodiment of the present disclosure, positive capacitors can be compensated by the negative capacitors to reduce a total capacitance between the conductive interconnecting components. FIG. 1 schematically shows a plurality of positive capacitors $C_1, \ldots, C_{m'}$ caused by the dielectric material, which constitutes a body of the IL, and a placed of negative capacitors $C_{n\_1}, \ldots, C_{n\_m}$ for compensate for the positive capacitors, wherein m is a positive integer no less than 1, and m' is a positive integer no less than 1. Such negative capacitors can be obtained by, e.g., introducing the negative capacitance material (e.g., by filling the negative capacitance material in the dielectric material as the body) between the conductive interconnecting components $M_1$ and $M_2$. In this example, these capacitors as shown as being connected in parallel.

A total capacitance $C_t$ between the conductive interconnecting components $M_1$ and $M_2$ can be expressed as follows:

$$C_t = \sum_{i=1}^{m'} C_i - \sum_{i=1}^{m} |C_{n\_i}|$$

It can be seen that, due to the negative capacitors, the total capacitance $C_t$ can be reduced to even close to 0 (zero) compared to a structure in which only the dielectric material is arranged between the conductive interconnecting components $M_1$ and $M_2$. Preferably, $C_t$ is set to be no less than zero to ensure electrical stability of the device.

The above analysis shows that the capacitance between the conductive interconnecting components can be suppressed by introducing the negative capacitance material between the dielectric material as the body of the IL. Preferably, the positive capacitors and the negative capacitors are connected in parallel to ensure the capacitance suppressing effect effectively. For example, the negative material can extend from a surface of $M_1$ to a surface of $M_2$ that is opposite to the surface of $M_1$ to form the negative capacitors with $M_1$ and $M_2$ as plates. On the other hand, $M_1$ and $M_2$ also constitute plates of the positive capacitors formed by the dielectric material as the body of the IL. In other words, the positive and negative capacitors can share the same plates, thereby being connected in parallel.

Techniques of the present disclosure can be presented in various ways, some examples of which will be described below. Compensation for the capacitance between the conductive interconnects or wirings is described below as an example because the capacitance is relatively large because the conductive interconnects or wirings are generally longer. Of course, the techniques of the present disclosure may be applied to other situations where the capacitance is required to be reduced.

FIGS. 2(a)-2(g) schematically show sectional views of some stages in a process of manufacturing a metallization stack according to an embodiment of the present disclosure.

Figure 2A:
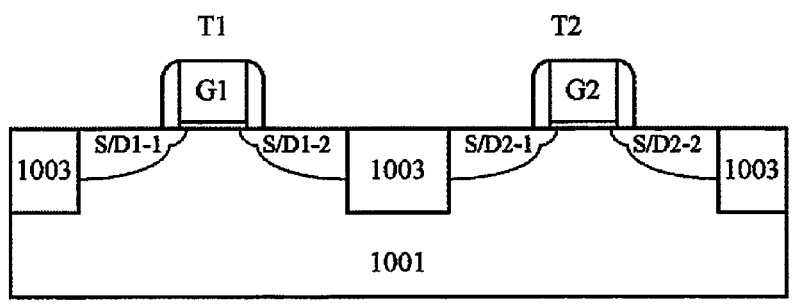
FIGS. 2(a)-2(g) schematically show sectional views of some stages in a process of manufacturing a metallization stack according to an embodiment of the present disclosure.

As shown in FIG. 2(a), a substrate 1001 is provided. Here, a silicon wafer is described as an example. However, the present disclosure is not limited thereto, but may be applied to other various forms of substrates, such as a germanium substrate, a semiconductor-on-insulator (SOI) substrate, a compound semiconductor substrate, and the like. A shallow trench isolation (STI) 1003 for defining an active region may be formed in the substrate 1001.

Desired devices, such as transistors T1 and T2, can be formed on the substrate 1001. The transistor T1 may include a gate (G1) and source/drain regions (S/D1-1, S/D1-2). Likewise, the transistor T2 may include a gate (G2) and source/drain regions (S/D2-1, S/D2-2). The transistor T1 may be an n-type device, and the transistor T2 may be a p-type device. Accordingly, a p-type well and an n-type well may be formed in the substrate 1001 to form T1 and T2 therein, respectively. It is to be noted that although the CMOS process is used as an example herein, the present disclosure is not limited thereto.

The devices T1 and T2 may be of various types of devices, such as metal oxide semiconductor field effect transistors (MOSFETs), fin field effect transistors (FinFETs), bipolar junction transistors, and the like. Those skilled in the art will recognize a variety of ways to form a variety of devices in a substrate. In addition, the resulting device is not limited to a transistor, but may include a variety of devices that may be formed on a substrate or in a substrate, such as a diode, a capacitor, a resistor, or the like.

After forming the devices such as T1 and T2, a metallization stack may be formed on the substrate to achieve interconnects between the devices and/or connections to the outside of the devices. As described above, the metallization stack can be formed by successively forming the interlayer dielectric layers (ILs) on the substrate 1001 and forming conductive interconnecting components such as the contact, the conductive via, the conductive interconnect or wiring, or the like therein.

Figure 2B:
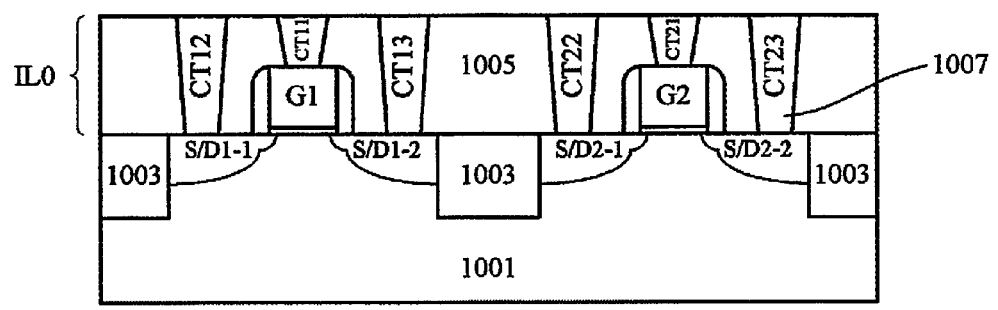

Specifically, as shown in FIG. 2(b), the interlayer dielectric layer IL0 1005 may be formed on the substrate. For example, an IL0 1005 may be formed by depositing an oxide (e.g., silicon oxide) on the substrate 1001, such as by chemical vapor deposition (CVD), and performing planarization such as chemical mechanical polishing (CMP). Then, the contact 1007 may be formed in the IL0 1005, and in this example, specifically, the contact may include contacts CT11, CT12, CT13, CT21, CT22, CT23 corresponding to terminals of the devices T1 and T2. There may be a plurality of ways to form the contact 1007. For example, a through-hole in the IL0 1005 may be formed at positions corresponding to the terminals of the devices T1 and T2 in the IL0 1005, and a conductive material for example a metal such as Cu, Al or W etc. may be filled therein to form contacts 1007. Alternatively, a diffusion barrier layer such as TiN may be formed on an inner wall of the through-hole, and then a metal may be filled in the through-hole.

Figure 2C:
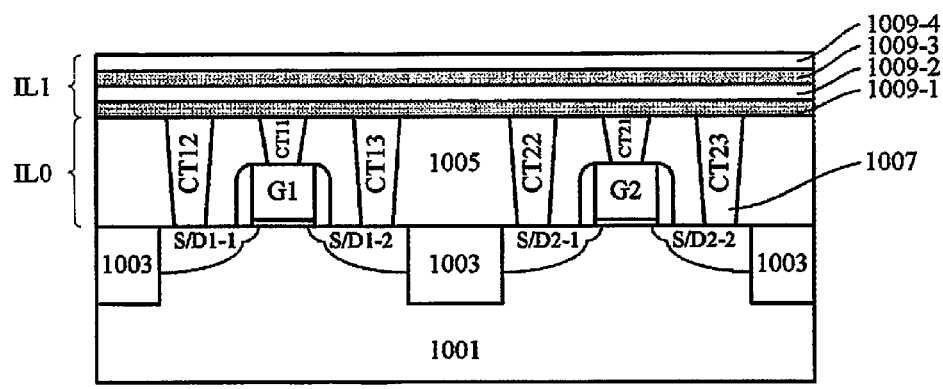

Next, as shown in FIG. 2(c), an interlayer dielectric layer IL1 may be formed on the IL0. In this example, the IL1 includes a stack of sub-layers 1009-2, 1009-4 with a dielectric material, such as an oxide (e.g., silicon oxide), a nitride (e.g., silicon nitride), or other low-k dielectric material, and sub-layers 1009-1, 1009-3 with a negative capacitance material, such as $HfZrO_2$, $BaTiO_3$, $KH_2PO_4$ or NBT, or any combination thereof, and the like. These stacks are stacked along the stacking direction of the metallization stack (vertical direction in the figure). It is to be noted that the material and the thickness of each sub-layer are not necessarily the same. In addition, a number of the dielectric material sub-layers 1009-2, 1009-4 is not limited to 2 as shown in the figure, but may be 1 or any other positive integer. Similarly, a number of the negative capacitance material sub-layers 1009-1, 1009-3 is not limited to 2 as shown in the figure, but may be 1 or any other positive integer.

Figure 2D:
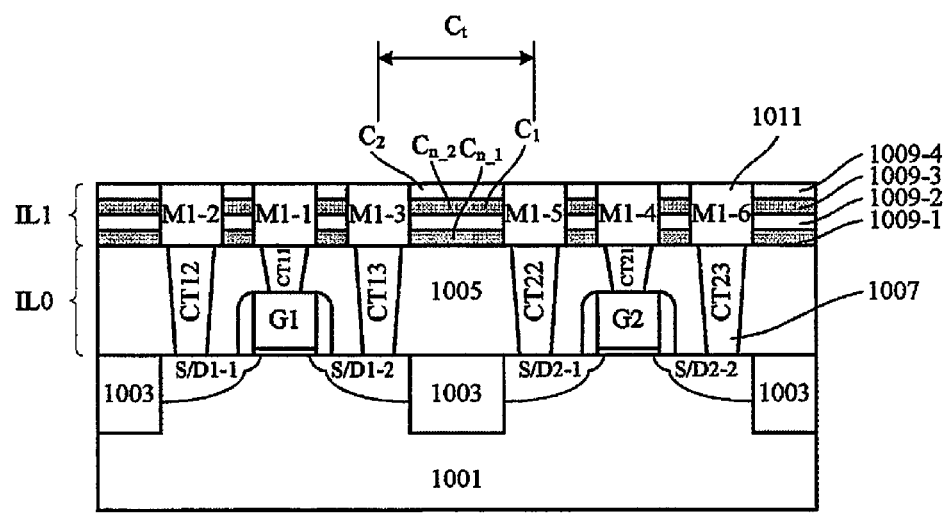

In the interlayer dielectric layer IL1, a first metal layer (Metal 1) 1011 may be formed. In this example, as shown in FIG. 2(d), the first metal layer 1011 may include conductive interconnects M1-1, M1-2, M1-3, M1-4, M1-5, M1-6 that electrically contact respective contacts CT11, CT12, CT13, CT21, CT22, CT23 respectively. These conductive interconnects can be designed according to the circuit and arranged along a certain line in the IL1, so that the contacts CT11, CT12, CT13, CT21, CT22, CT23 are connected to each other, connected to the contacts corresponding to the terminals of other devices, or connected to other conductive interconnecting components in an upper layer (hereinafter IL2), such as a conductive via, and the like. Such a conductive interconnect can be formed by forming a trench (which passes through IL1) extending in accordance with a designed path in IL1 and filling the trench with a conductive material, for example, a metal such as Cu, Al or W or the like. Alternatively, a diffusion barrier layer such as TiN may be previously formed on the inner wall of the trench, and then the metal may be filled in the trench.

Next, an embodiment will be described with respect to an adjacent pair of conductive interconnects M1-3 and M1-5. As M1-3 and M1-5 are opposite to each other and a dielectric material and a negative capacitance material are sandwiched therebetween, a capacitance $C_t$ is generated. Here, the capacitance $C_t$ includes a negative capacitance $C_{n\_t}$ caused by a portion of the negative capacitance material sub-layer 1009-1 between the conductive interconnects M1-3 and M1-5, a positive capacitance $C_1$ caused by a portion of the dielectric material sub-layer 1009-2 between the conductive interconnects M1-3 and M1-5, a negative capacitance $C_{n\_2}$ caused by a portion of the negative capacitance material sub-layer 1009-3 between the conductive interconnects M1-3 and M1-5, and a positive capacitance C2 caused by a portion of the dielectric material sub-layer 1009-4 between the conductive interconnects M1-3 and M1-5. Also, because these capacitors each share the same plates M1-3 and M1-5, they are connected in parallel. Therefore, as described above, a total capacitance $C_t=C_1+C_2-|C_{n\_1}|-|C_{n\_2}|$ is reduced as compared with the case where only the dielectric material is arranged between M1-3 and M1-5. In this example, the values of the capacitors may be adjusted so that $C_t$ is close to zero (but preferably greater than zero) by adjusting a thickness of one or more of the sub-layers (i.e., a dimension in a vertical direction in the figure). Of course, it is also possible to select the material with the appropriate (positive/negative) dielectric constant for respective sub-layers to adjust the capacitance value. The same is true between other conductive interconnects that are opposite to each other.

It is to be noted here that the alternating stacked structure of the dielectric material and the negative capacitance material may be limited to localized regions of the interlayer dielectric layer IL1, for example, disposed between the conductive interconnects opposite to each other, and in the remaining regions, still may be consisted entirely of the dielectric material as a conventional interlayer dielectric layer.

Figure 2E:
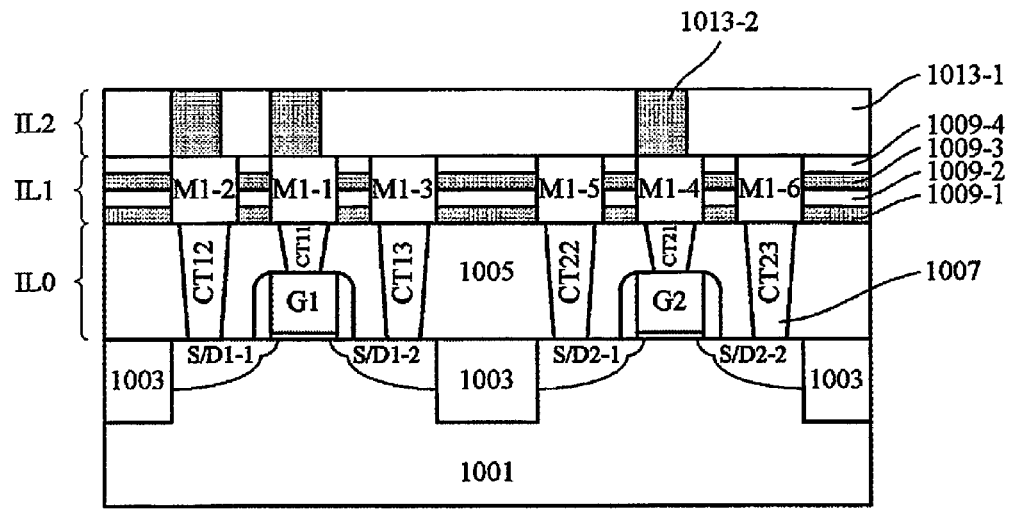

Next, as shown in FIG. 2(e), a next interlayer dielectric layer IL2 may be formed on the IL1. In this example, the IL2 includes a body 1013-1 of a dielectric material and a negative capacitance material 1013-2 embedded in the body. For example, the dielectric layer (thickness may be, for example, about 10 to 500 nm) may be formed on the IL1 as the body by deposition and planarization treatment, and then a trench is formed at a desired position in the body and the negative dielectric material is filled in the trench to form the interlayer dielectric layer IL2. The position embedded with the negative capacitance material may be set according to a layout of the conductive interconnects in the metallization stack, e.g., between conductive interconnects that are opposite to each other (but not electrically connected to each other).

Figure 2F:
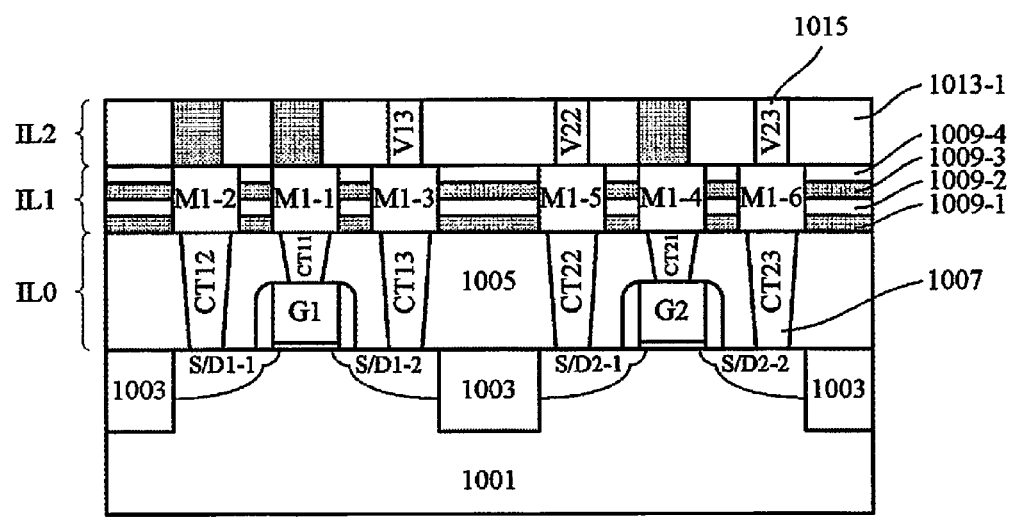

In addition, in the IL2, it is also possible to form the desired conductive interconnecting components, such as the conductive via 1015, as shown in FIG. 2(f). In this example, the conductive vias V13, V22, V23 are formed corresponding to the conductive interconnects M1-3, M1-5, M1-6, and these conductive vias V13, V22, V23 may electrically connect the respective conductive interconnects M1-3, M1-5, M1-6 to the upper layer. For example, the conductive vias 1015 may be formed by forming through-holes in the IL2 at the respective positions in the IL2 and filling therein the conductive material for example metal such as Cu, Al or W or the like. Alternatively, a diffusion barrier layer such as TiN may be previously formed on the inner wall of the through-holes, and then the metal may be filled in the through-hole.

Figure 2G:
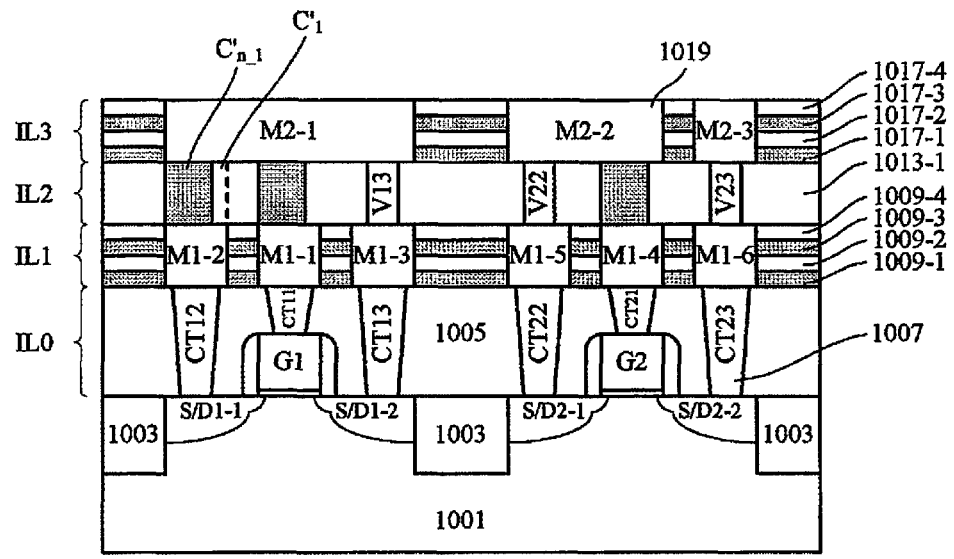

Next, as shown in FIG. 2(g), a next interlayer dielectric layer IL3 may be formed on the IL2. Similarly to the IL1, the interlayer dielectric layer IL3 may comprise a stack of sub-layers 1017-2, 1017-4 with the dielectric material and sub-layers 1017-1, 1017-3 with the negative capacitance material. These stacks are stacked along the stacking direction of the metallization stack (vertical direction in the figure). With respect to the interlayer dielectric layer IL3, reference may be made to the above description for the interlayer dielectric layer IL1.

Likewise, in the interlayer dielectric layer IL3, a second metal layer (Metal 2) 1019 may be formed. In this example, the second metal layer 1019 may include conductive interconnects M2-1, M2-2, M2-3 that electrically contact the respective conductive vias V13, V22, V23, respectively. With regard to these conductive interconnects, reference may be made to the above description for the conductive interconnects in IL1.

As described above, the total capacitance can be reduced because of a stack of the dielectric material sub-layers and the negative capacitance material sub-layers between the opposite conductive interconnects, such as between M2-1 and M2-2, between M2-2 and M2-3.

On the other hand, an embodiment of the present disclosure will be described with respect to the conductive interconnects opposite to each other between the upper and lower layers, for example, M2-1 in the IL3 and M1-2 in the IL1. Because M2-1 and M1-2 are opposite to each other and there is a dielectric material and a negative capacitance material therebetween, producing a capacitance $C'_t$ therebetween. Here, the capacitance $C'_t$ includes a negative capacitance $C'_{n\_1}$ caused by a portion of the negative capacitance material 1013-2 in the IL2 between the conductive interconnects M2-1 and M1-2 and a positive capacitance $C'_1$ caused by a portion of the dielectric material 1013-1 in the IL2 between the conductive interconnects M2-1 and M1-2. Further, since the respective dielectric materials or negative capacitance materials of these capacitors are arranged adjacent to each other in an in-plane direction of the metallization stack so as to share the same plates M2-1 and M1-2, they are connected in parallel. Therefore, as described above, the total capacitance $C'_t = C'_1 - |C'_{n\_1}|$ is reduced as compared with the case where only the dielectric material is arranged between M2-1 and M1-2. In this example, the values of the capacitors can be adjusted so that $C'_t$ is close to zero (but preferably greater than zero) by adjusting the width of the negative capacitance material 1013-2 (dimension in the horizontal direction in the figure). Of course, it is also possible to select a material with an appropriate (positive/negative) dielectric constant to adjust the capacitance value. The same is true between other conductive interconnects in the IL3 and IL1 that are opposite to each other (but not electrically connected to each other).

Alternatively, IL2 may comprise a body made of a negative capacitance material and a dielectric material embedded in the body. For example, 1013-1 shown in FIG. 2(f) may refer to a negative capacitance material, and 1013-2 may refer to a dielectric material. In this case, the $C'_t$ reduction can also be achieved.

Figure 3A:
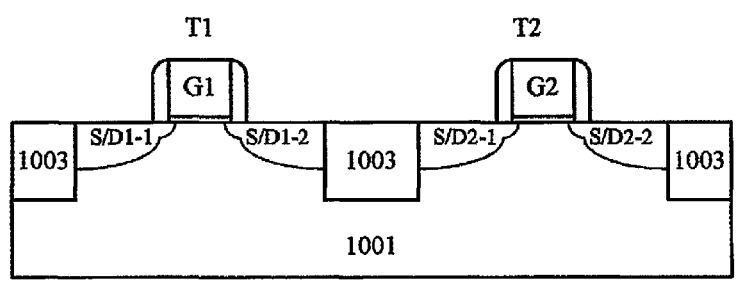

FIGS. 3(a)-3(e') schematically show sectional views of some stages in a process of manufacturing a metallization stack according to another embodiment of the present disclosure, wherein, similar reference numerals as in FIGS. 2(a)-2(g) are used to denote similar elements.

As shown in FIG. 3(a), a substrate 1001 is provided on which devices T1 and T2 are formed. For details, reference may be made to the above description of FIG. 2(a). Next, a metallization stack may be formed.

Specifically, as shown in FIG. 3(b) (top view) and FIG. 3(b') (sectional view taken along the line AA' in FIG. 3(b)), an interlayer dielectric layer IL0 1005 may be formed on the substrate. In addition, a contact 1007 may be formed in the IL0 1005. For their material and means of formation, reference may be made to the above description of FIG. 2(b). In this embodiment, unlike the above-described embodiment, the positions, in which the contacts CT11, CT21 corresponding to the gates G1, G2 are formed, are deviated from the positions, in which the contacts corresponding to the source/drain region are formed, so as to avoid interference therebetween. Two contacts are formed on source/drain region, respectively.

Next, as shown in FIG. 3 (c) (top view) and FIG. 3(c') (sectional view taken along the line AA' in FIG. 3 (c)), a next interlayer dielectric layer IL1 1009 may be formed on the IL0, and a first metal layer (Metal 1) 1011 may be formed in the interlayer dielectric layer IL1. In this example, IL1 may comprise only dielectric material. In this example, a conductive interconnect M1-1/M1-4 that electrically connects the respective gates G1, G2 of the devices T1 and T2 to each other, a conductive interconnect M1-3/M1-5 that electrically connects one of the source/drain S/D1-2 of T1 and one of the source/drain S/D2-1 of T2 to each other, a conductive interconnect M1-2 that is electrically connected to another one of the source/drain S/D1-1 of T1, and a conductive interconnect M1-6 that is electrically connected to another S/D2-2 of the source/drain of T2 are shown. However, the connections between the devices are not limited to this, but may be determined based on the circuit design.

Next, as shown in FIG. 3(d) (top view) and FIG. 3 (d') (a sectional view taken along line BB' in FIG. 3 (d)), a trench R may be formed in the interlayer dielectric layer IL1 1009. For example, trench R may be formed between the opposite surfaces of the first metal layer (Metal 1) 1011 by photolithography. Here, it is preferable that a bottom surface of the trench R is lower than a bottom surface of the first metal layer 1011.

Then, as shown in FIG. 3(e) (top view) and FIG. 3(e') (a sectional view taken along line BB' in FIG. 3(e)), a negative capacitance material 1021 may be filled in the trench R. Thus, between the opposite conductive interconnects, for example between M1-1/M1-4 and M1-2, between M1-1/M1-4 and M1-3/M1-5, between M1-1/M1-4 and M1-6, the dielectric material and the negative capacitance material are arranged adjacent to each other in the in-plane direction of the metallization stack so that a positive capacitor and a negative capacitor are arranged in parallel between these conductive interconnects. As described above, this capacitor arrangement can reduce the total capacitance between the conductive interconnects. Here, the capacitance value can be adjusted so that the total capacitance is close to zero (but preferably greater than zero) by adjusting a shape, size, or type of negative capacitance material, etc. in the trench.

According to an embodiment of the present disclosure, there is also provided a semiconductor device comprising the above metallization stack. For example, such metallization stack may interconnect the various components, such as transistors, formed on the substrate and connect to external terminals.

The semiconductor device according to an embodiment of the present disclosure can be applied to various electronic devices. For example, by integrating a plurality of such semiconductor devices and other devices (e.g., other forms of transistors, etc.), an integrated circuit (IC) can be formed and thereby an electronic device is constructed. Accordingly, the present disclosure also provides an electronic device comprising the above-described semiconductor device. The electronic device may also include a display screen in conjunction with an integrated circuit and a wireless transceiver in conjunction with an integrated circuit. Such electronic device comprise such as smart phones, tablet PCs (PCs), personal digital assistants (PDAs), and the like.

In the above description, detailed description is not made for the layers of layout, etching or other technical details. It will be understood by those skilled in the art that the layers, regions, etc. of desired shapes may be formed by various technical means. In addition, in order to form the same structure, those skilled in the art can devise a method which is not exactly the same as the method described above. In addition, although the embodiments have been described above separately, it does not mean that the measures in the various embodiments cannot be advantageously used in combination.

The embodiments of the present disclosure have been described above. However, these embodiments are for only illustrative purposes and are not intended to limit the scope of the present disclosure. The scope of the present disclosure is defined by the appended claims and their equivalents. Various alternatives and modifications may be made by those skilled in the art without departing from the scope of the present disclosure, and such alternatives and modifications are intended to be within the scope of the present disclosure.

I claim:

1. A metallization stack, comprising:
at least an interlayer dielectric layer comprising a dielectric material and a negative capacitance material, wherein:
at least a pair of first conductive interconnecting components formed in the interlayer dielectric layer, which are at least partially opposite to each other, comprise both the dielectric material and the negative capacitance material sandwiched between their opposite parts; and/or
at least a second conductive interconnecting component formed in an upper interlayer dielectric layer and at least a third conductive interconnecting component formed in a lower interlayer dielectric layer, which are at least partially opposite to each other, comprise both the dielectric material and the negative capacitance material sandwiched between their opposite parts,
wherein the interlayer dielectric layer comprises at least one sub-layer of the dielectric material and at least one sub-layer of the negative capacitance material, which are stacked alternately with respect to each other.

2. The metallization stack of claim 1, wherein the dielectric material and the negative capacitance material are stacked substantially along a stack direction of the metallization stack between the opposite parts of the pair of the first conductive interconnecting components.

3. The metallization stack of claim 1, wherein the interlayer dielectric layer comprises a sub-layer of the dielectric material and a sub-layer of the negative capacitance material, which are stacked along a stack direction of the metallization stack.

4. The metallization stack of claim 1 wherein the dielectric material and the negative capacitance material are arranged adjoining each other along an in-plane direction of the metallization stack between the opposite parts of the pair of the first conductive interconnecting components.

5. The metallization stack of claim 4, wherein:
the dielectric material constitutes a main body of the interlayer dielectric layer; and
the negative capacitance material is embedded in at least one trench formed in the main body.

6. The metallization stack of claim 5, wherein the trench extends from one of the pair of the first conductive interconnecting components to another of the pair of the first conductive interconnecting components.

7. The metallization stack of claim 5, wherein a plurality of the trenches are formed between the opposite parts of the pair of the first conductive interconnecting component.

8. The metallization stack of claim 5, wherein a bottom surface of the negative capacitance material is lower than a bottom surface of the first conductive interconnecting component.

9. The metallization stack of claim 1, wherein the dielectric material and the negative capacitance material are arranged adjoining each other along an in-plane direction of the metallization stack between the opposite parts of the pair of the second conductive interconnecting components and the third conductive interconnecting component.

10. The metallization stack of claim 9, wherein:
the dielectric material constitutes a main body of the interlayer dielectric layer, and the negative capacitance material is embedded in at least one trench formed in the main body; or
the negative capacitance material constitutes a main body of the interlayer dielectric layer, and the dielectric material is embedded in at least one trench formed in the main body.

11. The metallization stack of claim 1, wherein a dimension of the dielectric material and/or a dimension of the negative capacitance material between the opposite parts is configured such that a total capacitance generated between the opposite parts is less than a capacitance generated by only filling the dielectric material between the opposite parts, and no less than zero.

12. A semiconductor device comprising the metallization stack according to claim 1.

13. An electronic device comprising an integrated circuit including the semiconductor device of claim 12.

14. The electronic device of claim 13, further comprising: a display cooperating with the integrated circuit and a wireless transceiver cooperating with the integrated circuit.

* * * * *